United States Patent
Nishi et al.

(10) Patent No.: US 8,240,543 B2
(45) Date of Patent: Aug. 14, 2012

(54) ELECTRONIC COMPONENT MOUNTING SYSTEM, ELECTRONIC COMPONENT PLACING APPARATUS, AND ELECTRONIC COMPONENT MOUNTING METHOD

(75) Inventors: Syoichi Nishi, Fukuoka (JP); Mitsuhaya Tsukamoto, Fukuoka (JP); Masahiro Kihara, Fukuoka (JP); Masafumi Inoue, Saga (JP)

(73) Assignee: Panasonic Corporation, Osaka (JP)

( * ) Notice: Subject to any disclaimer, the term of this patent is extended or adjusted under 35 U.S.C. 154(b) by 324 days.

(21) Appl. No.: 12/162,588

(22) PCT Filed: Mar. 26, 2007

(86) PCT No.: PCT/JP2007/057329
§ 371 (c)(1),
(2), (4) Date: Jul. 29, 2008

(87) PCT Pub. No.: WO2007/116848
PCT Pub. Date: Oct. 18, 2007

(65) Prior Publication Data
US 2009/0014501 A1    Jan. 15, 2009

(30) Foreign Application Priority Data
Mar. 29, 2006   (JP) ................................. 2006-091201

(51) Int. Cl.
B23K 31/12      (2006.01)
B23K 31/00      (2006.01)
H01L 21/00      (2006.01)
(52) U.S. Cl. ..................... 228/103; 228/105; 228/248.1; 228/180.22
(58) Field of Classification Search .................. 228/102, 228/103, 105, 8–12; 29/593, 739, 833, 840, 29/832, 740; 438/14, 106–127, 612; 118/663, 118/713, 712
See application file for complete search history.

(56) References Cited

U.S. PATENT DOCUMENTS
5,108,024 A * 4/1992 Kazem-Goudarzi et al. . 228/104
(Continued)

FOREIGN PATENT DOCUMENTS
CN     1498065 A     5/2004
(Continued)

OTHER PUBLICATIONS
International Search Report for PCT/JP2007/057329; Jul. 6, 2007.
(Continued)

*Primary Examiner* — Kiley Stoner
*Assistant Examiner* — Carlos Gamino
(74) *Attorney, Agent, or Firm* — Pearne & Gordon LLP

(57) ABSTRACT

Regarding electronic component mounting in which an electronic component having plural solder bumps for external connection on its lower surface is mounted on a board, in an electronic component mounting operation of previously measuring the height position of solder paste on the board on which the solder paste has been printed, and mounting the electronic component on the board on which the solder paste has been printed by a loading head, whether the transfer of the solder paste to the solder bumps is necessary or not is judged on the basis of the measurement result of the height of the solder paste. In case that it is judged that the transfer is necessary, the transfer of the solder paste is executed, and thereafter the electronic component is mounted on the board. Hereby, it is possible to prevent the poor joint in case that a thin-sized semiconductor package which causes easily warp deformation is mounted on the board by soldering.

2 Claims, 9 Drawing Sheets

U.S. PATENT DOCUMENTS

| | | | | |
|---|---|---|---|---|
| 5,601,229 | A * | 2/1997 | Nakazato et al. | 228/246 |
| 5,709,905 | A * | 1/1998 | Shaw et al. | 427/8 |
| 5,740,729 | A * | 4/1998 | Hikita et al. | 101/126 |
| 5,862,973 | A * | 1/1999 | Wasserman | 228/105 |
| 5,882,720 | A * | 3/1999 | Legault et al. | 427/8 |
| 6,258,612 | B1 * | 7/2001 | Master et al. | 438/15 |
| 6,389,683 | B1 * | 5/2002 | Mori et al. | 29/740 |
| 6,529,624 | B1 * | 3/2003 | Kim | 382/150 |
| 6,757,966 | B2 * | 7/2004 | Inoue et al. | 29/840 |
| 6,789,720 | B2 * | 9/2004 | Uchida et al. | 228/22 |
| 6,944,521 | B2 | 9/2005 | Yoshida et al. | |
| 6,983,538 | B2 * | 1/2006 | Inoue et al. | 29/840 |
| 7,025,244 | B2 * | 4/2006 | Haji | 228/9 |
| 7,163,137 | B2 * | 1/2007 | Yamamoto | 228/103 |
| 7,201,802 | B2 * | 4/2007 | Holm et al. | 118/663 |
| 7,630,536 | B2 * | 12/2009 | Fukagawa et al. | 382/151 |
| 7,870,991 | B2 * | 1/2011 | Okamoto et al. | 228/103 |
| 2002/0185309 | A1 | 12/2002 | Imamura et al. | |
| 2003/0029033 | A1 * | 2/2003 | Hidese et al. | 29/833 |
| 2004/0085701 | A1 | 5/2004 | Inoue et al. | |
| 2004/0146195 | A1 | 7/2004 | Fukagawa et al. | |
| 2005/0102052 | A1 | 5/2005 | Yoshida et al. | |
| 2006/0071052 | A1 * | 4/2006 | Conlon et al. | 228/103 |
| 2007/0130755 | A1 * | 6/2007 | Duquette et al. | 29/740 |
| 2008/0257937 | A1 * | 10/2008 | Kihara et al. | 228/9 |
| 2010/0230472 | A1 * | 9/2010 | Okamoto et al. | 228/104 |

FOREIGN PATENT DOCUMENTS

| | | |
|---|---|---|
| JP | 2000-315896 | 11/2000 |
| JP | 2006267018 A * | 10/2006 |
| WO | 01-88473 | 11/2001 |
| WO | WO 03064973 A1 * | 8/2003 |

OTHER PUBLICATIONS

Chinese Office Action dated Mar. 10, 2010.

* cited by examiner

ELECTRONIC COMPONENT MOUNTING SYSTEM, ELECTRONIC COMPONENT PLACING APPARATUS, AND ELECTRONIC COMPONENT MOUNTING METHOD

TECHNICAL FIELD

The present invention relates to an electronic component mounting system, an electronic component placing apparatus, and an electronic component mounting method, in which an electronic component on which solder bumps are formed is mounted on a board by soldering.

BACKGROUND ART

As a form of mounting an electronic component such as semiconductor element on a circuit board, a method of mounting a semiconductor package in which the semiconductor element is mounted on a resin board, on the circuit board through solder bumps by soldering has been used (refer to, for example, Patent Reference 1). In this referred example, an image of the lower surface of the package is picked up to recognize the solder bumps, whereby the bump arrangement and the positional shift of the bump are automatically detected, and data for judgment of the quality of the component and for positional correction are obtained.

[Patent Reference 1] JP-A-2000-315896

DISCLOSURE OF THE INVENTION

With recent advance in size-reduction and enhanced features of the electronic equipment, an electronic component built in the electronic equipment, such as a semiconductor package requires high-density mounting, and its size-reduction and thickness-reduction are advancing. Therefore, there is a characteristic that: the semiconductor package in which the solder bumps are formed becomes also lower in rigidity due to the thickness-reduction of the resin board, so that warp-deformation is easily produced in the semiconductor package by heating in the reflow time for soldering. Therefore, the solder bumps float due to the warp-deformation in the reflow time, and the solder bumps are not solder-joined normally onto the connection electrodes of the board, so that poor joint such as poor conduction or a shortage of joint strength arises easily.

Therefore, an object of the invention is to provide an electronic component mounting system, an electronic component placing apparatus, and an electronic component mounting method, in which it is possible to prevent poor joint in case that a thin-sized semiconductor package is mounted on a board by soldering.

An electronic component mounting system of the invention, which is constituted by coupling plural apparatuses for electronic component mounting, and mounts on a board an electronic component having solder bumps for external connection on the lower surface, includes:

a printing apparatus which prints solder paste on plural electrodes for electronic component joint which are formed on the board;

a height measuring means which executes three-dimensional measurement for the post-print board thereby to measure the height position of the printed solder paste;

an electronic component placing apparatus including a solder paste supply part that transfer-coats the solder bumps of the electronic component with the solder paste, and a loading head that picks up an electronic component from a component supply part, the electronic component placing apparatus mounting the electronic component on which the solder paste has been transferred on the board on which the solder paste has been printed;

a reflow device which heats the board on which the electronic component has been mounted thereby to heat and melt the solder bumps and the solder paste, and solder-joins the electronic component onto the board; and a solder paste transfer necessity judging means which judges, on the basis of the measurement result of the height of the solder paste by the height measuring means, whether or not the transfer of the solder paste to the solder bumps by the solder paste supply part is necessary.

An electronic component placing apparatus of the invention, which mounts on a board an electronic component having plural solder bumps for external connection on the lower surface, includes a board positioning part which positions the board having electrodes on which the solder paste has been printed in the previous step;

a component placing mechanism which mounts the electronic component by a loading head on the board on which the solder paste has been printed; a solder paste supply part which coats the solder bumps of the electronic component with the solder paste by transfer; and a solder paste transfer necessity judging means which judges, on the basis of the measurement results of the height positions of the solder paste printed on the electrodes in the previous step, whether or not the transfer of the solder paste to the solder bumps by the solder paste supply part is necessary.

An electronic component mounting method of the invention, which mounts on a board an electronic component by soldering by means of an electronic component system constituted by coupling plural apparatuses for electronic component mounting, includes:

a printing step of printing solder paste on electrodes for electronic component joint which are formed on the board by a printing apparatus;

a measurement step of executing three-dimensional measurement for the post-print board thereby to measure the height position of the printed solder paste; an electronic component mounting step of picking up an electronic component from a component supply part by a loading head and mounting the electronic component on the board on which the solder paste has been printed; and a reflow step of heating the board on which the electronic component has been mounted thereby to heat and melt the solder bumps and the solder paste, and soldering the electronic component onto the board, wherein, on the basis of the measurement result of the height of the solder paste, whether or not the transfer of the solder paste to the solder bumps by the solder paste supply part is necessary is judged; and in case that it is judged that the transfer is necessary, the transfer of the solder paste onto the solder bumps is executed, and thereafter the electronic component is mounted on the board.

According to the invention, whether the transfer of the solder paste to the solder bumps is necessary or not is judged on the basis of the measurement result of height of the solder paste, and in case that it is judged that the transfer is necessary, the transfer of the solder paste onto the solder bumps is executed and thereafter the electronic component is mounted on the board. Hereby, it is possible to prevent poor joint in case that the thin-sized semiconductor package is mounted on the board by soldering.

BEST MODE FOR CARRYING OUT THE INVENTION

Figure 1:
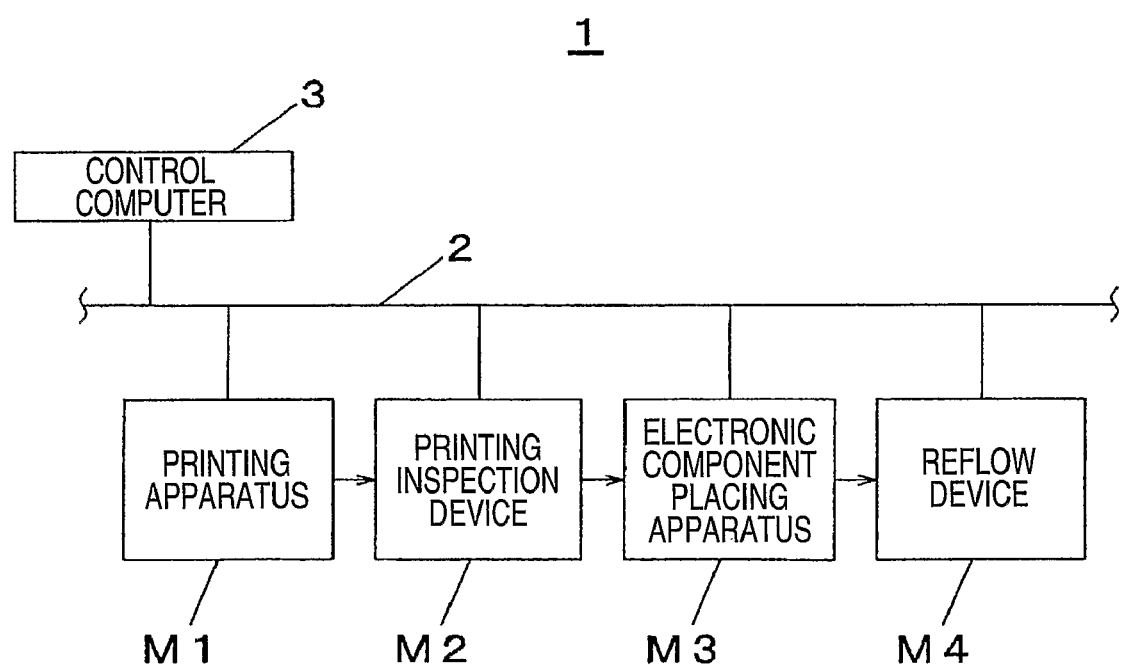
FIG. 1 is a block diagram showing the constitution of an electronic component mounting system in one embodiment of the invention.

Next, an embodiment of the invention will be described with reference to drawings. Referring first to FIG. 1, the electronic component mounting system will be described. In the electronic component mounting system in FIG. 1, a printing apparatus M1, a printing inspection device M2, an electronic component placing apparatus M3, and a reflow device M4 all of which are electronic component mounting devices are coupled to constitute an electronic component mounting line 1, their devices are connected by a communication network 2, and the whole of the electronic component mounting system 1 is controlled by a control computer 3. In the embodiment, by these plural electronic component mounting devices, the electronic part having plural solder bumps for external connection on its surface is solder-joined to the board and mounted thereon, whereby a mounting board is manufactured.

The printing apparatus M1 screen-prints, on electrodes formed on the board onto which the electronic component is to be mounted correspondingly to arrangement of solder bumps of the electronic component, solder paste for joining the electronic component. The printing inspection device M2 has a function of picking up an image of the post-print board to recognize the plane position of the printed solder paste thereby to inspect the printing state, and further executing three-dimensional measurement for the post-print board thereby to measure the height position of the printed solder paste. The electronic component placing apparatus M3 mounts the electronic component by a loading head on the board on which the solder paste has been printed. The reflow device M4 applies heat to the board on which the solder paste has been printed, thereby to heat and melt the solder bumps and the solder paste and solder-join the electronic component onto the board.

Figure 2:
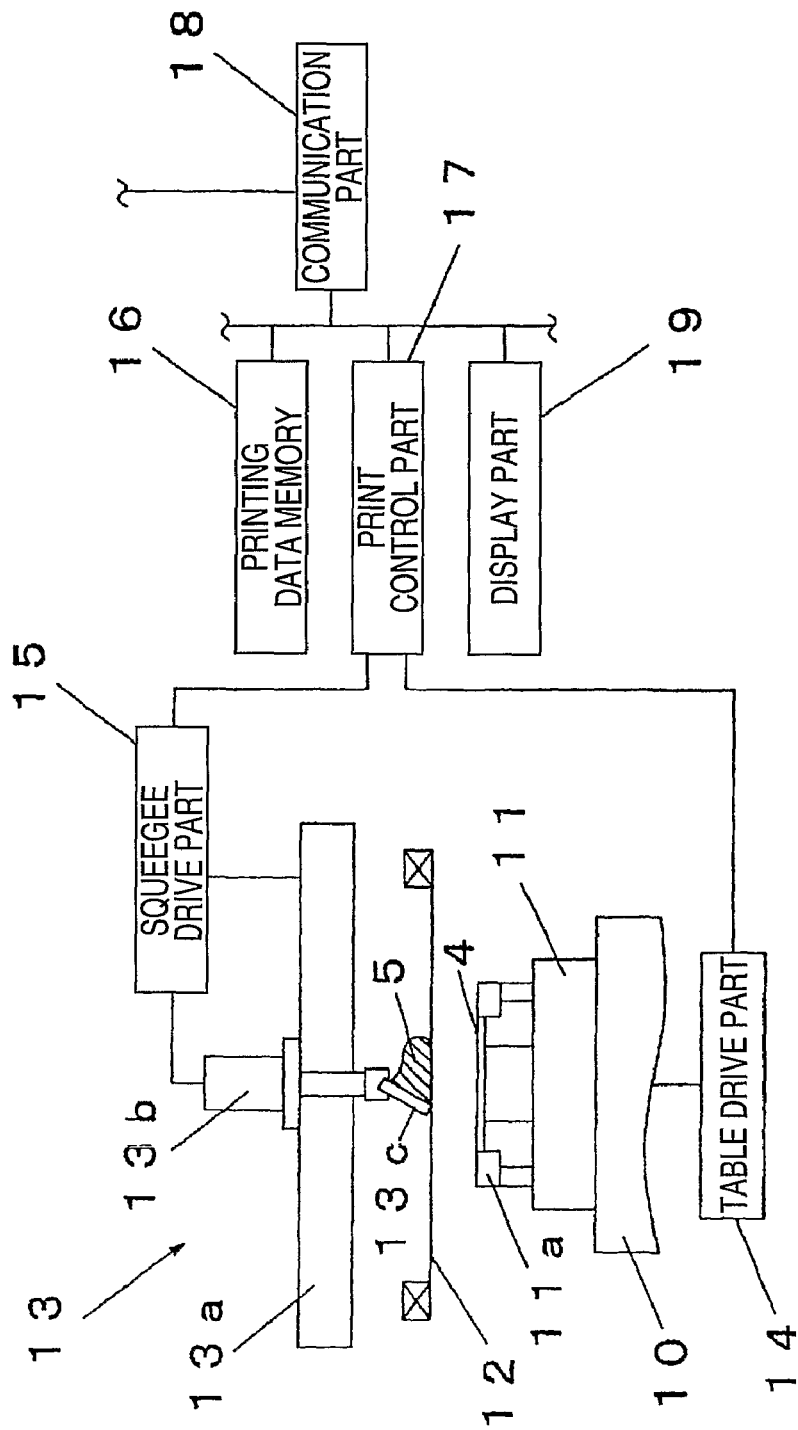
FIG. 2 is a block diagram showing the constitution of a screen printing apparatus in one embodiment of the invention.

Next, the constitutions of the printing apparatus M1, the printing inspection device M2, and the electronic component placing apparatus M3 will be described. Referring first to FIG. 2, the constitution of the printing apparatus M1 will be described. In FIG. 2, on a positioning table 10, a board holder 11 is arranged. The board holder 11 holds a board 4 with the board 4 between clampers 11a. Above the board holder 11, a mask plate 12 is arranged, and the mask plate 12 is provided with pattern holes (not shown) corresponding to the printing portions of the board 4. A table drive part 14 drives the positioning table 10, whereby the board 4 moves horizontally and vertically in relation to the mask plate 12.

Above the mask plate 12, a squeegee part 13 is arranged. The squeegee part 13 includes an up-down press mechanism 13b which moves a squeegee 13c up and down in relation to the mask plate 12 and presses the squeegee 13c on the mask plate 12 by the predetermined press power (by the predetermined applied press), and a squeegee moving mechanism 13a which moves the squeegee 13c horizontally. The up-down press mechanism 13b and the squeegee moving mechanism 13a are driven by a squeegee drive part 15. In a state where the board 4 is brought into contact with the lower surface of the mask plate 12, the squeegee 13c is moved horizontally along a surface of the mask plate 12 on which the solder paste 5 has been supplied at a predetermined speed, whereby the solder paste 5 is printed through the not-shown pattern holes on the upper surfaces of electrodes 4a formed on the board 4 (refer to FIG. 7(a)).

This printing operation is performed by controlling the table drive part 14 and the squeegee drive part 15 by a print control part 17. In this control, on the basis of printing data stored in a printing data memory part 16, the operation of the squeegee 13c and the alignment between the board 4 and the mask plate 12 are controlled. A display part 19 displays various index data indicating the operating state of the printing apparatus, and abnormal information indicating abnormality of the print-operating state. A communication part 18 performs data transmission and reception through the communication network 2 between the printing apparatus and the control computer 3 or another device constituting the electronic component mounting line 1.

Figure 3:
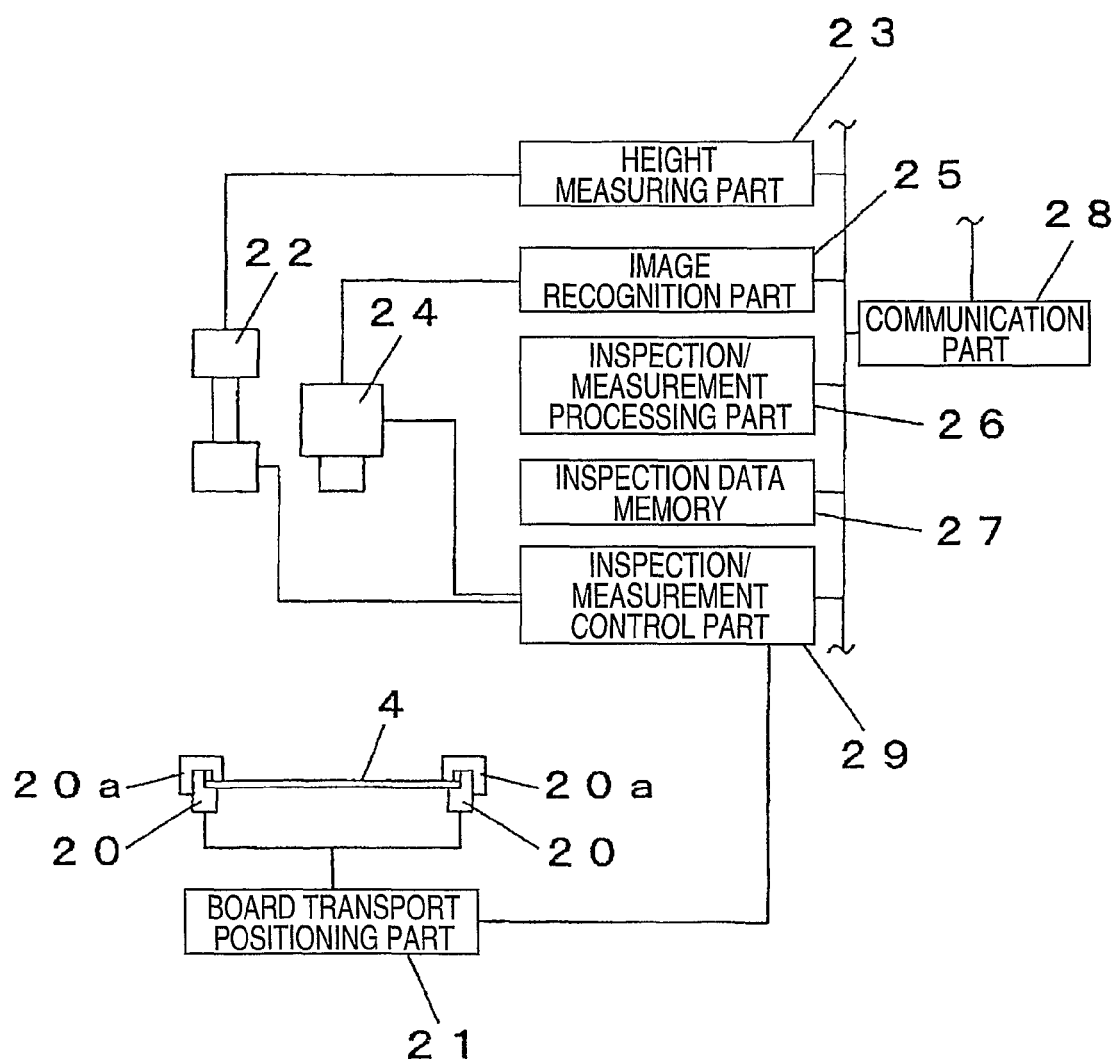
FIG. 3 is a block diagram showing the constitution of a printing inspection device in one embodiment of the invention.

Next, referring to FIG. 3, the printing inspection apparatus M2 will be described. In FIG. 3, the board 4 is held by transport rails 20 in a state where both ends of the board 4 are clumped by clamp members 20a. By driving a board transport positioning part 21, the transport rails 20 transport and locate the board in a position for below-described inspection and measurement.

Above the board 4 held by the transport rails 20, a height meter 22 and a board-recognition camera 24 are arranged. The height meter 22 has a function of measuring the distance to an object of measurement accurately. The height of the surface of the board 4 and the height of the solder paste 5 printed on the electrode 4a of the board 4 are measured by the height meter 22, and the measurement data is processed by a height measuring part 23, whereby the height position of the surface of the board 4 and the height position of the solder paste 5 printed on each electrode 4a can be obtained. Therefore, the height measuring function provided for the printing inspection device M2 becomes height measuring means which measures the height position of the printed solder paste 5.

In the electronic component mounting method indicated in the embodiment, the amount of the solder paste 5 on the board 4 is assumed on the basis of a result of this height measurement, and whether or not the solder amount for soldering of the electronic component to be mounted on this board 4 is enough to secure the normal soldering is judged. For this purpose, the solder paste 5 printed on each electrode 4a may be a direct object of height measurement. Alternatively, the warp deformation state of the board 4 is found with plural board height measurement points which have been previously set on the board 4 as the objects of measurement, and the height position of the solder paste 5 may be assumed from this result.

Further, the result of the image picked up by the board recognition camera 24 is recognized by an image recognition part, whereby the plane position of the solder paste 5 and the printed area are detected, and whether or not the printing state is normal or not, that is, whether or not the solder paste 5 is normally printed can be inspected. The height meter 22 and the board recognition camera 24 can be moved respectively by the moving means in the horizontal face, and they can take the arbitrary position of the board 4 as the object of height measurement or the object of inspection.

The height data of the solder paste 5 or the board 4 which has been obtained by the height measurement, and the result of printing state inspection are data-processed by an inspection/measurement processing part 26. Hereby, together with the result indicating whether the printing state on each post-print board 4 is good or bad, the solder height position data which indicates the height position of the solder paste 5 printed on the board, and the board warp deformation data are outputted. These outputted data are transferred through the communication part 28 and the communication network 2 to the control computer 3 and another device. The inspection/measurement control part 29, by controlling the board transport positioning part 21, the height meter 22 and the board recognition camera 24, controls the inspection/measurement operation.

Figure 4:
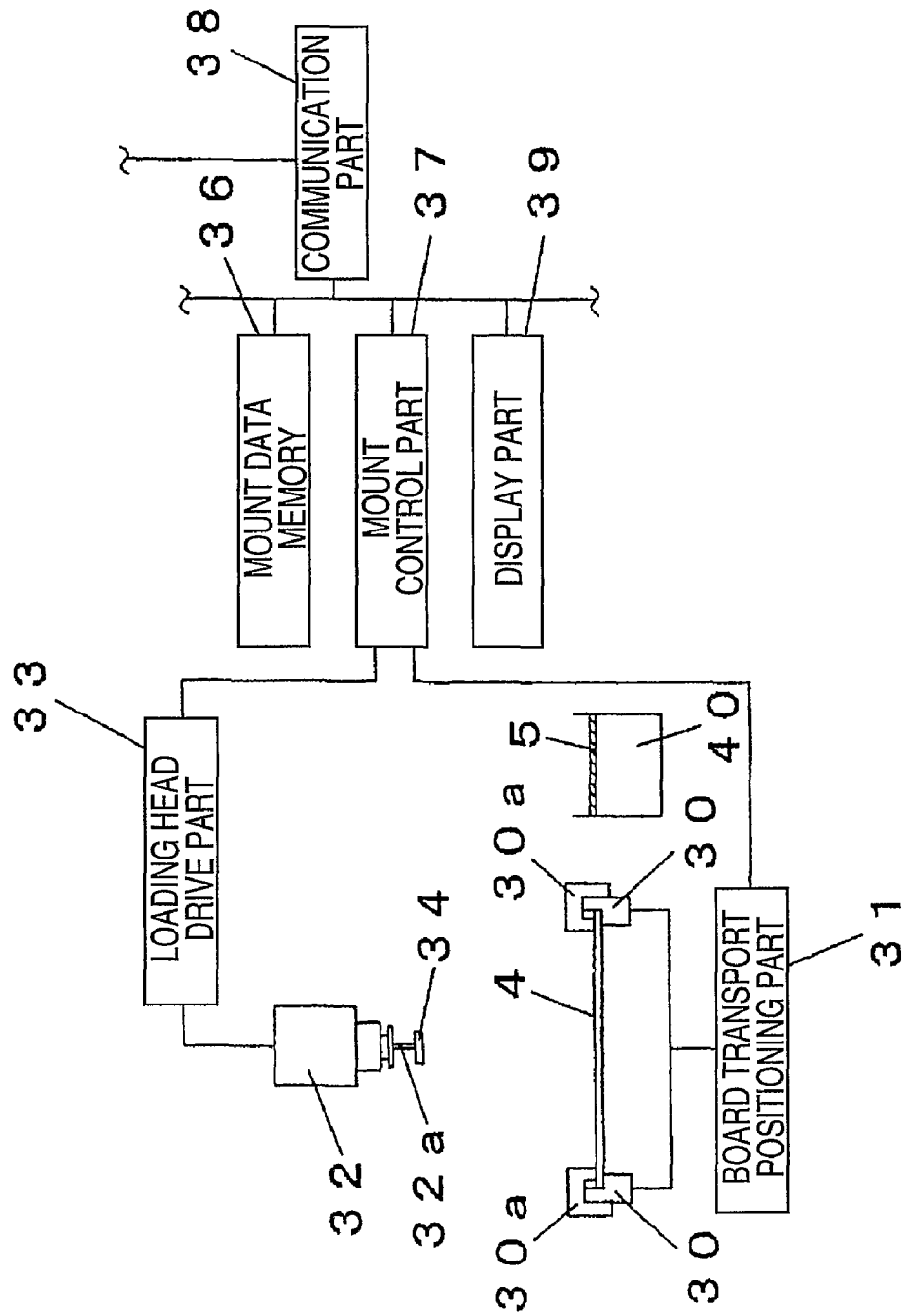
FIG. 4 is a block diagram showing the constitution of an electronic component placing apparatus in one embodiment of the invention.

Next, referring to FIG. 4, the constitution of the electronic component placing apparatus will be described. In FIG. 4, the board 4 is held by transport rails 30 in a state where both ends of the board 4 are clumped by clamp members 30a. The clump members 30a in the transport rail 30 which clump the board 4 has the same structure as that of the clump members 20a in the transport rail 20 in the printing inspection device M2, and hold the board 4 in the same clamp state as that in the printing inspection time. By driving a board transport positioning part 31, the transport rails 30 transport and locate the board 4 on which the solder paste 5 have been printed on the electrodes 4a in the previous step in the below-described component mounting position of a loading head 32. The board transport positioning part 31 and the transport rails 30 function as the board positioning part which performs positioning of the board 4 in which the solder paste has been printed on the electrodes 4a in the previous step.

Above the board 4 held by the transport rails 30, the loading head 32 which is moved by a head drive mechanism (not shown) is arranged. The loading head 32 has a nozzle 32a which absorbs the electronic component, and absorbs and holds the electronic component by means of the nozzle 32a to take the electronic component out of a component supply part (not shown). Thereafter, the loading head 32 is moved over the board 4 and moved down in relation to the board 4, whereby the electronic component held by the nozzle 32a is mounted on the board 4. The loading head 32 and the not-shown head drive mechanism constitute a component placing mechanism which mounts the electronic component on the board 4 on which the solder paste 5 has been printed. In the mounting operation by this component placing mechanism, on the basis of the mount data stored in a mount data memory part 36, that is, on the basis of the mount coordinates of the electronic component on the board 4, a mount control part 37 controls the board transport positioning part 31 and a loading head drive part 33, whereby the electronic component mounting position on the board 4 by the loading head 32 can be controlled.

Figure 8:
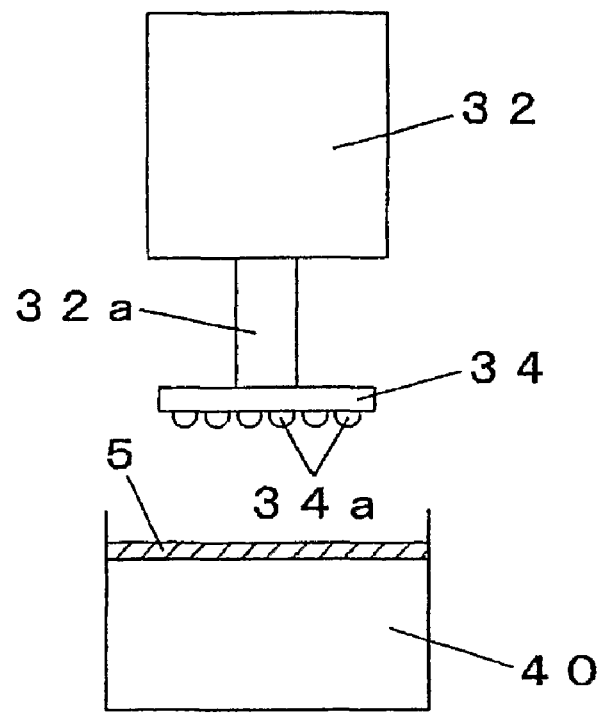
Figure 8:
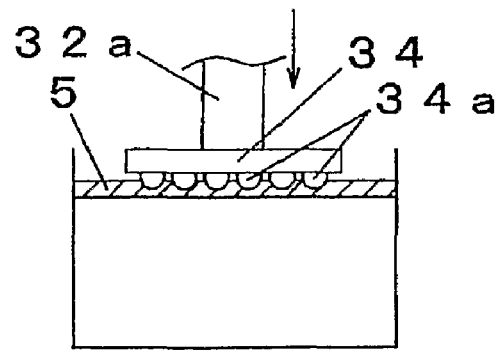
Figure 8:
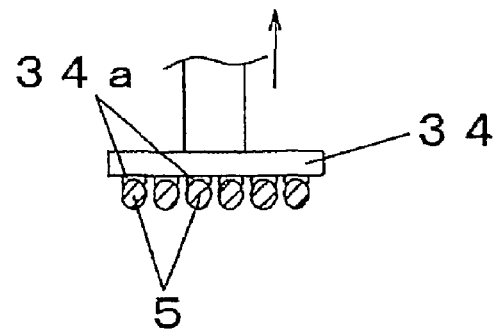

In the moving passage where the loading head 32 moves over the board 4, a solder supply part 40 which supplies the solder paste 5 in the predetermined coating thickness state is arranged. The solder supply part 40 is used in order to apply the solder paste onto solder bumps 34a of an electronic component 34 by transfer. Namely, the loading head 32 which is holding the electronic component 34 which has the solder bumps 34a on its lower surface by the nozzle 32a is moved over the solder supply part 40, the electronic component 34 is moved down in relation to the solder supply part 40, and the solder bumps 34a are brought into contact with the solder paste 5, whereby the solder bumps 34 are coated with the solder paste 5 by the transfer (refer to FIG. 8).

In the embodiment, as described later, whether the transfer of the solder paste 5 is necessary or not is judged by the state of the solder paste 5 on the board 4. This judgment is performed by comparison-reference by the mount control part 37 between the measurement result in the printing inspection device M2 and an allowed value data stored in the mount data memory 36. Therefore, the mount control part 37 functions as solder paste transfer necessity judging means which judges whether or not the transfer of the solder paste 5 onto the solder bumps 34a by the solder supply part 40 is necessary on the basis of the measurement result of the height of the solder paste 5 which has been obtained by the height measuring means provided for the printing inspection device M2.

A display part 39 displays index data indicating the various operating states of the electronic component placing apparatus M3, and abnormal information indicating abnormality of the mount-operating state. A communication part 38 performs data transmission and reception through the communication network 2 between the electronic component placing apparatus and the control computer 3 or another device constituting the electronic component mounting line 1.

Figure 5:
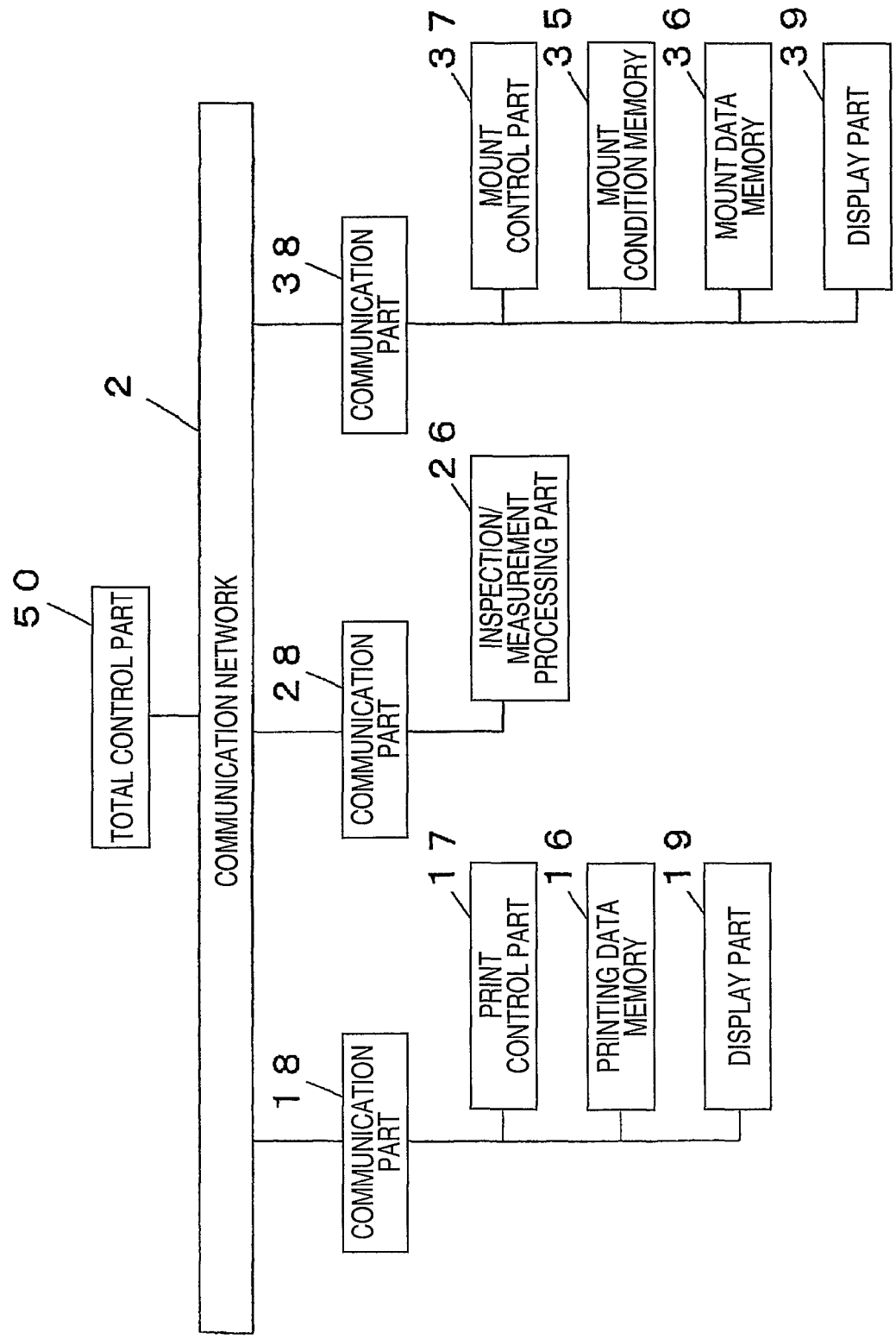
FIG. 5 is a block diagram of a control system in the electronic component mounting system in one embodiment of the invention.

Next, referring to FIG. 5, the constitution of a control system of the electronic component mounting system will be described. Herein, a data transmission and reception function which has the object to renew control parameters in the electronic component mounting process will be described. In FIG. 5, a total control part 50 fulfills the data transmission and reception function in the control processing range executed by the control computer 3. The total control part 50 receives the data transferred through the communication network 2 from each device constitution the electronic component mounting line, and outputs data through the communication network 2 to each device as parameter renewal data on the basis of processing algorithm which has been previously set.

Namely, the inspection/measurement processing part 26 provided for the printing inspection device M2 shown in FIG. 3 is connected through the communication part 28 to the communication network 2. Further, the respective parts (refer to FIGS. 2 and 4) provided for the printing apparatus M1 and the electronic component placing apparatus M3 are connected through the communication part 18, 38 to the communication network 2. Hereby, feedback processing of correcting/renewing control parameters of the upstream-sided device on the basis of the data obtained in the inspection/measurement step in the printing inspection device M2, and feed-forward processing of correcting/renewing control parameters of the downstream-sided device can be performed at any time while each device is operating. Further, the control computer 3 may not be provided as long as the data transmission and reception control function is provided in the control part of each device.

In the constitution of the above electronic component mounting system, the printing inspection device M2 is independently put between the printing apparatus M1 and the electronic component placing apparatus M3. However, the function of the printing inspection device M2 may be attached to the printing apparatus M1 or the electronic component placing apparatus M3. Namely, in the printing apparatus M1, the height meter 23 and the board recognition camera 24 are arranged so that the height measurement and the printing inspection for the post-print board 4 can be performed, and the functions of the height meter 22, the board recognition camera 24, the image recognition part 25, the inspection/measurement processing part 26, the inspection data memory 27, and the inspection/measurement control part 28 are added to the control function of the printing apparatus M1. Hereby, for the post-print board 4, the printing inspection and the height measurement similar to those in the printing inspection device M2 can be performed in the printing apparatus M1. Also in case that these functions are attached to the electronic component placing apparatus M3, the printing inspection and the height measurement can be similarly performed. In this case, in the electronic component placing apparatus M3, the similar printing inspection and height measurement for the board 4 which has been directly transported from the printing apparatus M1 are executed prior to the component mounting operation.

Figure 6:
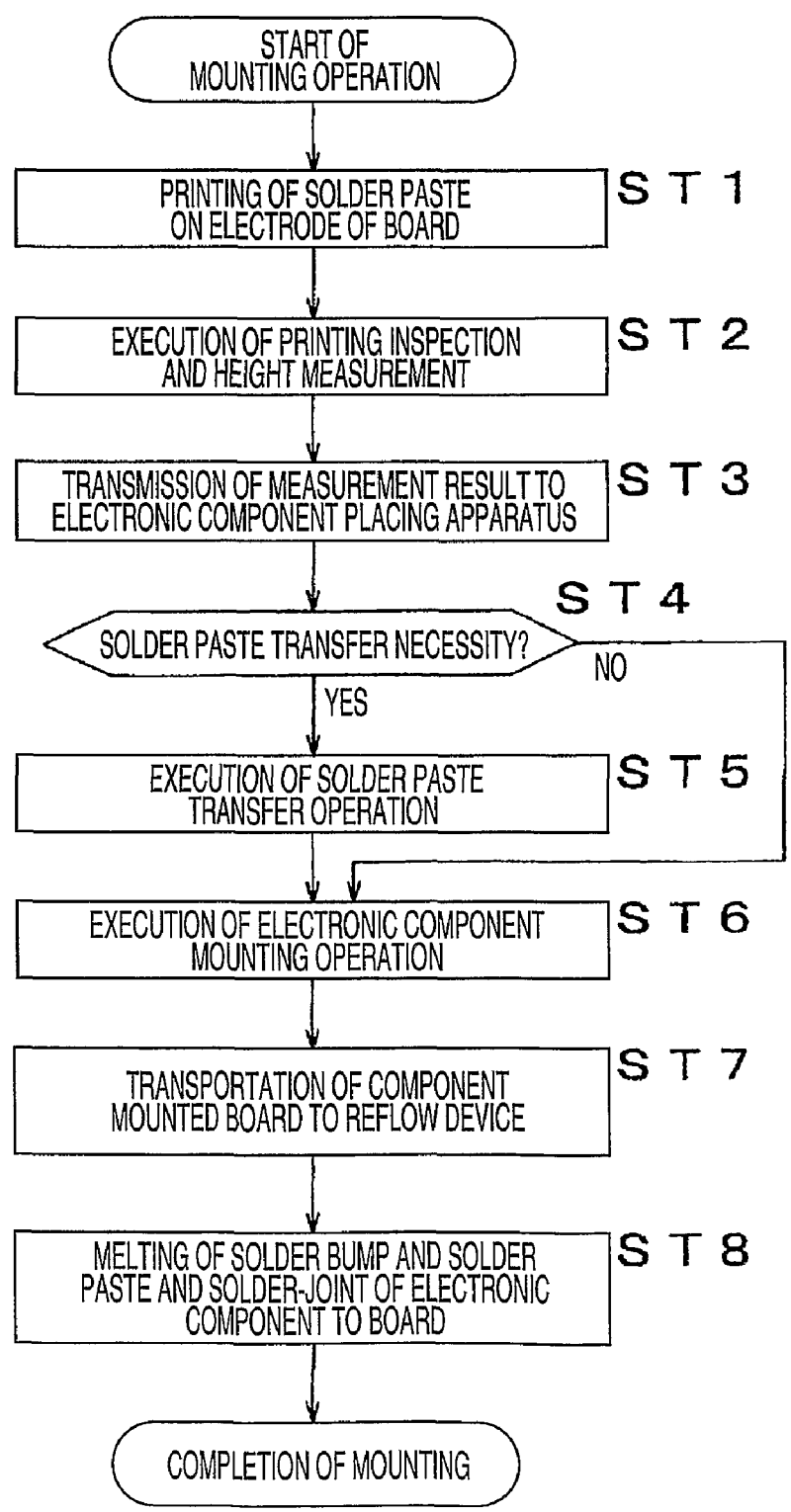
FIG. 6 is a flowchart showing an electronic component mounting method in one embodiment of the invention.
Figure 7:
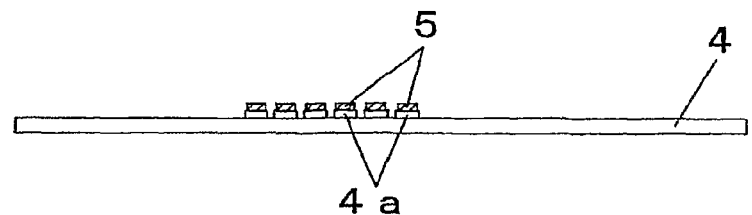
FIGS. 7, 8 and 9 are diagrams for explaining steps of the electronic component mounting method in one embodiment of the invention.
Figure 7:
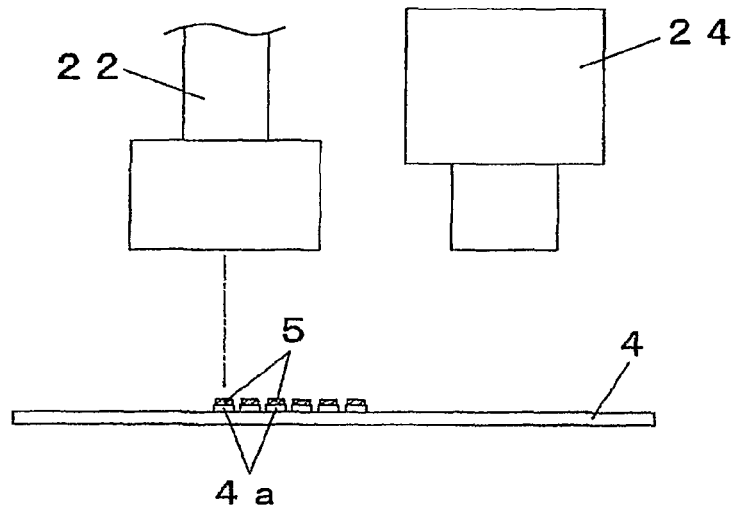
Figure 7:
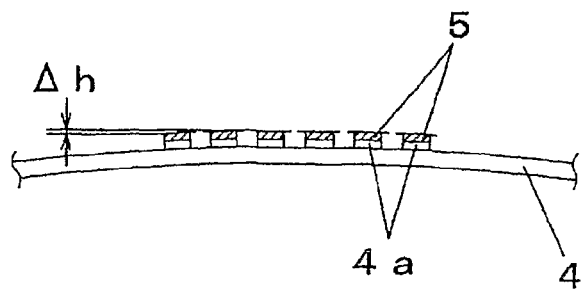

Next, the electronic component mounting method of mounting the electronic component 34 having the plural solder bumps 34a on its lower surface on the board 4 by the electron component mounting system in the embodiment will be described along a flow in FIG. 6 referring to each figure. First, by the printing apparatus M1, as shown in FIG. 7(a), the solder paste 5 is printed on the electrodes 4a of the board 4 (printing step) (ST1). Next, the post-print board 4 is transported in the printing inspection device M2, and the printing inspection and the height measurement for the board 4 are executed as shown in FIG. 7(b) (ST2). Namely, an image of the solder paste 5 printed on the electrodes 4a is picked up and recognized by the board recognition camera 24 thereby to perform the printing inspection, and the height position of the solder paste 5 is measured by the height meter 22 (measurement step).

In the height measurement by the height meter 22, the height position of each solder paste 5 on the board 4 is measured, and the height position of the solder paste 5 in each section is individually obtained. From these plural height measurement results, a deviation Δh in height of the solder paste 5 is determined.

Though the deviation Δh is caused almost by warp deformation of the board 4, it can be caused also by variation of the printing state in the printing apparatus M1. Such the variation is also detected as the deviation in height of the solder paste 5. In case that only the deviation caused by the warp deformation of the board 4 is used, not only the solder paste 5 is used as the object of the direct height measurement but also the warp deformation state of the board 4 may be detected from the results of measurement in plural board height measuring points thereby to assume the deviation Δh in height of the solder paste 5.

Thereafter, the thus-obtained measurement results are transmitted to the electronic component placing apparatus M3 (ST3), and the board 4 is transported to the electronic component placing apparatus M3. The mount control part 37, on the basis of the sent measurement results, judges whether or not the transfer of the solder paste is necessary (ST4). Namely, in case that the deviation Δh in height of the solder paste 5 on the board 4 exceeds the allowed value which has been previously set and stored in the mount data memory 36, probability that the poor connection arises due to distribution of the solder amount in the height direction is high, so that the mount control part 37 judges that it is necessary to add the solder paste 5 by the transfer. In case that the deviation Δh is the allowed value or less, the mount control part 37 judges that it is unnecessary to add the solder paste 5 by the transfer.

In case that the mount control part 37 has judged that the solder paste transfer is necessary, the solder paste transferring operation is executed (ST5). Namely, as shown in FIG. 8(a), the loading head 32 which holds the electronic component 34 by the absorption nozzle 32a is moved over the solder supply part 40 in which a coating film of the solder paste 5 is formed, and next the absorption nozzle 32a is moved down as shown in FIG. 8(b) to bring the solder bumps 34a into contact with the coating film of the solder paste 5. Thereafter, as shown in FIG. 8(c), the absorption nozzle 32a is moved up, whereby the predetermined amount of the solder paste 5 is supplied to the solder bumps 34a by the transfer.

Figure 9:
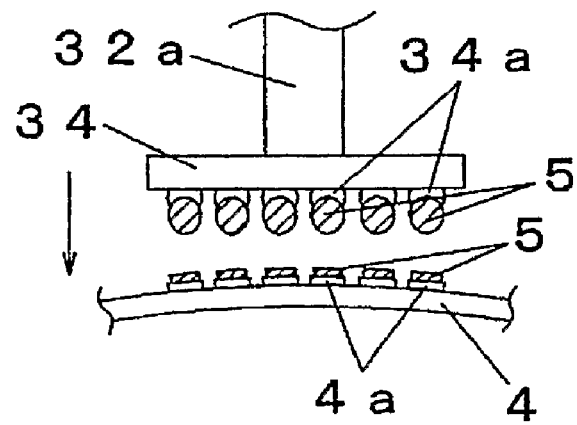
Figure 9:
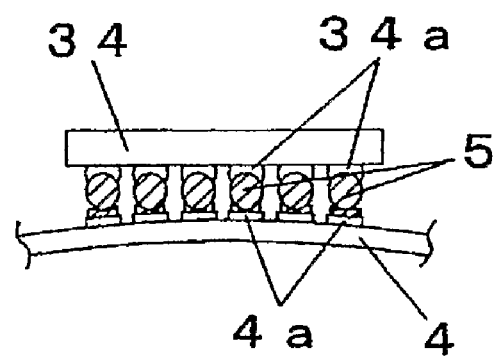
Figure 9:
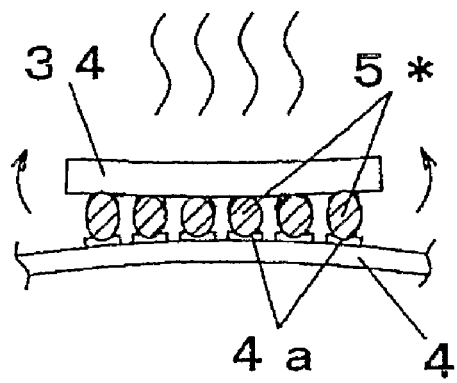

After the solder paste transferring operation has been executed, or in case that it is judged that the solder paste transfer is unnecessary in the ST4, the electronic component mounting operation is executed (electronic component mounting step) (ST6). FIG. 9(a) shows a state where the step shifts to the electronic component mounting operation after the solder paste transferring operation has been executed. Namely, in this state, due to the warp deformation of the board 4, the height position of the solder paste 5 printed on the electrode 4a located on the outer edge portion side is lower than the height position of the solder paste 5 printed on the electrode 4a located in the center.

In the electronic component mounting operation, firstly the solder bumps 34a are aligned with the solder paste 5 printed on the electrode 4a. Next, the absorption nozzle 32a is moved down, whereby the solder bumps 34a land on the electrodes 4a through the solder paste 5 as shown in FIG. 9(b). At this time, since the solder paste 5 is previously transferred onto the solder bumps 34a, even in the electrode 4a on the outer edge portion side which is lower in height position than the center portion, the solder paste 5 added to the solder bump 34a by the transfer comes surely into contact with the solder paste 5 printed on the electrode 4a.

Thereafter, the board 4 on which the electronic component has been mounted is transported to the reflow device M4 (ST7), and heated at the temperature of the solder melting point or higher. Hereby, the solder bumps 34a and the solder in the solder paste 5 are melted, and the electronic component 34 is solder-joined to the electrodes 4a on the board 4 (reflow step) (ST8). At this time, the electronic component 34 causes thermal deformation, and shows such deformation behavior that the outer edge portions warp upward. Therefore, the solder bumps 34a located at the outer edge portions deform together with the electronic component 34 so that the distance between the solder bump 34a and the electrode 4a increases.

Also in this case, the solder paste 5 of which the amount has been increased by the additive supply of the solder paste by the transfer is in a contact state with both of the solder bump 34a and the electrode 4a also in the electrode 4a on the outer edge portion side. Therefore, as shown in FIG. 9(c), the solder component obtained by melting of the solder bumps 34a is integrated with the solder component obtained by melting of the solder in the solder paste 5, thereby to form solder joint parts 5* which connect the electronic component 34 to the electrodes 4a electrically.

As described above, in the embodiment, whether the transfer of the solder paste to the solder bumps is necessary or not is judged on the basis of the height measurement result obtained by previously measuring the height position of the solder paste 5 on the board 4 on which the solder paste 5 has been printed. In case that it is judged that the transfer is necessary, after the transfer of the solder paste has been executed, the electronic component is mounted on the board. Hereby, it is possible to prevent the poor joint in case that the thin-sized semiconductor package which causes easily the warp deformation is mounted on the board by soldering.

This application is based upon and claims the benefit of priority of Japanese Patent Application No. 2006-91201 filed on Mar. 29, 2006, the contents of which are incorporated herein by reference in its entirety.

INDUSTRIAL APPLICABILITY

The electronic component mounting system and the electronic component mounting method of the invention have the advantage that it is possible to prevent the poor joint in case that the thin-sized semiconductor package which causes easily the warp deformation is mounted on the board by soldering, and are available in the filed in which the electronic component is mounted on the board by soldering to manufacture the mount board.

The invention claimed is:

1. An electronic component mounting method, comprising:
   printing solder paste on electrodes on a board by a printing apparatus;
   executing three-dimensional measurement for the board, thereby to measure the height of the printed solder paste;
   determining, on a basis of the measurement result of the height of the printed solder paste, the printed solder paste is insufficient;
   the electronic component mounting method further comprises:
   picking up an electronic component from a component supply part with a loading head and transferring additional solder paste to solder bumps on the electronic component by a solder paste supply part prior to mounting the electronic component on the board;
   mounting the electronic component on the board by contacting the printed solder paste on the electrodes on the board; and
   heating the board on which the electronic component has been mounted thereby to heat and melt the solder bumps and the printed and additional solder pastes, and soldering the electronic component onto the board.

2. The electronic component mounting method according to claim 1, wherein the measurement result of the height of the printed solder paste is a deviation in height of the printed solder paste obtained from plural measurement results of the height.

\* \* \* \* \*